United States Patent [19]

Spigarelli

[11] 4,315,042
[45] Feb. 9, 1982

[54] SOLDER REMOVAL TECHNIQUE

[75] Inventor: Donald J. Spigarelli, Carlisle, Mass.

[73] Assignee: Hybrid Technology Corporation, Concord, Mass.

[21] Appl. No.: 924,518

[22] Filed: Jul. 14, 1978

[51] Int. Cl.³ ............................ B23K 1/08; B05D 5/12
[52] U.S. Cl. ......................................... 427/96; 228/20;
228/40; 427/273; 427/377; 427/314; 134/107;
118/72
[58] Field of Search ................. 228/264, 20, 19, 36,
228/40, 21; 427/96, 98, 264, 273, 377;
134/105–108

[56] References Cited

U.S. PATENT DOCUMENTS

| | | | |
|---|---|---|---|
| 2,366,949 | 1/1945 | Woppman et al. | 134/105 |
| 3,308,839 | 3/1967 | Barday | 134/76 |
| 3,416,958 | 12/1968 | Oxford | 427/96 |
| 3,491,779 | 1/1970 | McLain et al. | 228/20 |
| 3,593,729 | 7/1971 | Goldware | 134/108 |
| 3,603,329 | 9/1971 | White | 228/20 |
| 3,724,418 | 4/1973 | McLain | 228/37 |
| 3,865,298 | 2/1975 | Allen et al. | 228/19 |
| 3,866,307 | 2/1975 | Pfahl, Jr. et al. | 228/34 |
| 3,904,102 | 9/1975 | Chu et al. | 228/180 |
| 4,077,467 | 3/1978 | Spigarelli | 134/107 |
| 4,115,601 | 9/1978 | Ammann et al. | 427/273 |

Primary Examiner—Daniel C. Crane
Attorney, Agent, or Firm—Robert F. O'Connell

[57] ABSTRACT

The method of solder leveling comprising maintaining a zone of hot saturated inert vapor at substantially the temperature of molten solder above a molten bath of solder, moving the part to be treated through the vapor at a rate such that it will become uniformly heated to substantially the temperature of the molten solder prior to immersion therein, immersing the part in the molten solder, withdrawing the part from the molten solder through the saturated vapor to the ambient atmosphere and, while withdrawing the part, projecting streams of hot, high density fluid on the surfaces of the part in directions opposite to the direction of withdrawal to sweep the surfaces of the excess solder.

29 Claims, 1 Drawing Figure

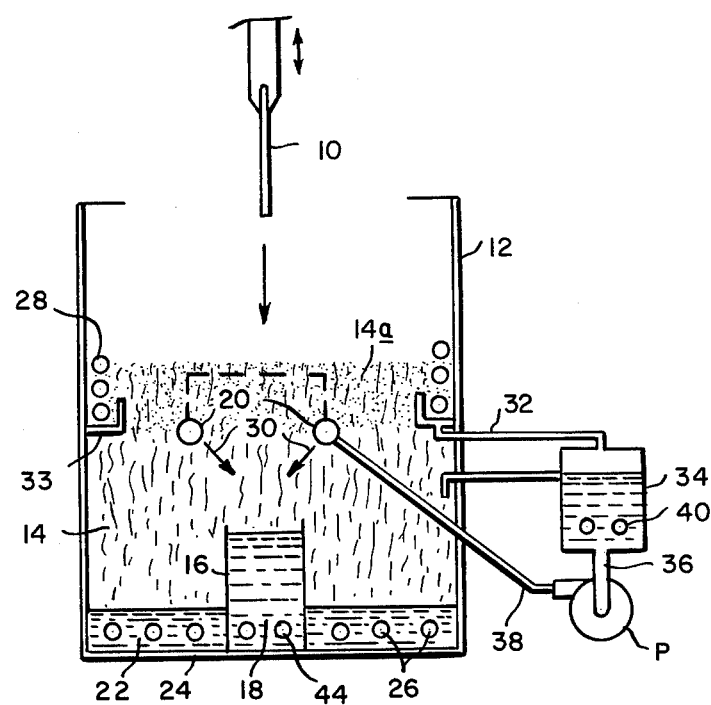

SOLDER REMOVAL TECHNIQUE

BACKGROUND OF INVENTION

Several techniques of "solder leveling" have been developed for obtaining uniformly thick coatings of solder on the order of 0.0003 to 0.0006 inches to parts such as printed circuit boards. According to one technique, after the board has been coated with solder by, for example, immersion in a liquid bath of solder, it is rotated so as to throw off the excess solder from the board by centrifugal forces. Apparatus for so leveling the solder is commonly known as a "Gerry Solder Slinger." This technique has not worked out satisfactorily and is not in general use. A second technique is to use hot oil jets and project these jets onto the surfaces of a part which has been immersed in molten solder to remove the excess solder in a controlled fashion. This technique has not been entirely satisfactory because it is difficult to obtain uniform thickness and it is hazardous because of the fact that the hot oil must be at a temperature near the flash point of the oil. Also, the technique is also somewhat messy. A third technique is leveling by means of hot air and, in this technique, the part is immersed in molten solder and, while it is being removed, is subjected to air jets which blow off the excess solder. This technique has gained some success and apparatus for carrying it out is manufactured by Gyrex, Electrovert and Hollis.

The principal objects of this invention are to provide a simplified method and apparatus for solder leveling which avoids the disadvantages of the prior art by separating the means for heating the solder from the means for effecting its removal so that optimum performance of each may be provided independently of the other and, hence, a more efficient use of energy less complexity of equipment and control and, hence, a substantial saving in the cost of equipment.

SUMMARY OF INVENTION

The method in its broadest aspect comprises supporting a part which has been coated with solder in a hot saturated vapor at substantially the temperature of the melting point of the solder and, while so supported, projecting jets of hot fluid against the surfaces at angles to the surfaces such as to effect leveling the surfaces to the desired thickness. More specifically, the method comprises preheating an uncoated part in a hot saturated vapor at a temperature to correspond substantially to that of the melting point of the solder to bring it up to a uniform temperature approximating that of the molten solder, immersing the part in the molten solder, withdrawing it from the molten solder and effecting leveling within the saturated atmosphere by projecting jets of a hot high density fluid onto the surfaces at angles to effect leveling to the desired thickness. According to the method, the vapor is generated by heating the high density fluid employed for effecting leveling to its boiling point. The saturated vapor is maintained in a zonal layer above the molten solder of such thickness that a part may be preheated as it is moved through it to substantially the temperature of the bath prior to submersion therein and, when removed, the solder coating can be kept sufficiently fluid to enable leveling within the time it is withdrawn from the bath and the time it is removed from the saturated vapor. The solder bath, fluid and vapor are preferably individually heated to the required temperature. The latent heat of condensation of the saturated vapor on the surfaces of the part as it is moved therethrough contributes to heating the part to the desired temperature. The jets of fluid are projected onto the surfaces of the part at angles inclined to the surfaces of about 15°–40° and at a pressure of approximately 5–40 lbs. per square inch.

The method is carried out by means of apparatus comprising a vessel for holding molten solder, a treating chamber surrounding the vessel for maintaining an atmosphere of saturated inert vapor above the vessel and the molten solder therein through which the part to be coated with solder is required to be traversed to be immersed in the molten solder, means for moving the part through the saturated vapor to immerse the part in the molten solder and to withdraw it from the molten solder and from the saturated vapor to the ambient atmosphere and nozzle means for directing hot jets of liquid against the surfaces of the part while being withdrawn in a direction to return the excess solder from the part to the vessel. The lower part of the treating chamber provides a container for the liquid and contains heating coils for heating the liquid to its boiling point. The upper part of the treating chamber provides a container for containment of the saturated vapor. A coil at the top of the treating chamber supplied with a cooling medium provides for effecting partial condensation of an upper layer of the saturated vapor to thus create a covering layer which confines the saturated vapor within the treating chamber. A gutter is supported within the treating chamber below the coil for receiving the condensate and there is means for conducting the condensate to a sump exteriorly of the treating chamber, means for heating the condensate in the sump and a pump for pumping the heated condensate to the nozzle means. Optionally, the nozzle means may be supplied with liquid from the bottom of the heating chamber by the pump. A heating coil may also be provided within the vessel for melting the solder.

The invention will now be described in greater detail with reference to the accompanying drawing which diagrammatically illustrates an apparatus for carrying out the method according to this invention.

It is the purpose of this invention to provide a method of leveling a coating of solder on an article, for example, a printed circuit board to obtain a controlled thickness of solder on the order of 0.0003. to 0.0006 inches.

In its broadest aspect, the method comprises supporting a part 10 which has been coated with solder in a treating chamber 12 containing a saturated vapor 14 at a temperature corresponding substantially to the temperature of the melting point of the solder and, while holding the part in the said saturated vapor, projecting jets 30—30 of hot high density fluid on the surfaces to level the solder to a predetermined desired thickness by sweeping the excess solder from the surfaces.

In practice, the coating and leveling are carried out successively as diagrammatically illustrated in the drawing by moving the part 10 to be coated downwardly through the open top of the vessel 12, through the layer 14 of saturated inert vapor, into a vessel 16 at the bottom of the treating chamber which contains molten solder 18 to thus coat the article, withdrawing the article from the vessel 16, through the layer 14 to the ambient atmosphere and, during such withdrawal, projecting by means of nozzles 20—20 jets 30—30 of saturated liquid onto the surfaces of the article opposite to the direction of withdrawal so as to sweep the excess solder from the surfaces of the part back into the vessel 16. The layer 14 of saturated inert vapor is maintained at a thickness above the solder within the vessel 16 such that, as the part is moved through it, the latent heat of condensation of the saturated inert vapor on the part will uniformly heat the part to a temperature corresponding substantially to the temperature of that of the molten solder and will remain fluid after withdrawal of the part until leveling is effected. The temperature of the saturated inert vapor should be from 415°–450° F. and the temperature of the part prior to immersion into the solder bath from 400°–410° F. A solder of 60/40 or 63/37 SnPb composition may be used. For the fluid and vapor, Fluorinert FC-70 may be used. By using a high density fluid, the vapor generated has a higher density than that of the ambient atmosphere, hence it is possible to obtain more uniform heating and, hence, to reduce the thermal shock to the article prior to immersion into the solder. The inert vapor minimizes oxidation of the solder and, hence, loss and its greater surface tension promotes better and more uniform solder flow.

The apparatus for carrying out the method as diagrammatically illustrated in the drawing comprises a treating chamber 12 of suitable size and configuration which has at its bottom and centered therein a vessel 16, the latter being of much smaller horizontal cross section so that its wall is surrounded on all sides by the interior of the treating chamber 12. The bottom portion of the treating chamber 12 surrounding the vessel 16 provides a relatively shallow pan 24 for holding the liquid 22 from which the saturated inert vapor is to be generated by boiling of the liquid. Boiling may be achieved, for example, by providing heating coils 26 at the bottom of the treating chamber 12. The saturated inert vapor generated by boiling of the liquid 22 at the bottom of the vessel 12 is maintained above the surface of the boiling liquid at a level which rises above that of the vessel 16 and the molten solder therein of such zonal thickness in the direction of introduction of the article into the solder bath to enable heating the part uniformly to substantially the temperature of the solder bath before it is immersed therein, thereby to avoid thermal shock. This is achieved by mounting a coil 28 internally of the treating chamber at the desired level and circulating a coolant through the coils to cause incipient condensation at this level, thus to provide a barrier or blanket 14a which will confine the saturated vapor below it. A gutter 33 is mounted to the wall of the treating chamber below the coil 28 to collect condensate running down the wall and this is conducted by means of a conductor 32 to a sump 34. Alternatively, a blanket of higher density vapor may be generated within the vessel above the saturated vapor for this purpose.

In order to effect leveling after coating, there are provided above the vessel 16 within the zonal layer 14 of saturated inert vapor transversely-spaced nozzle heads 20—20 appropriately supported in a position to direct jets 30—30 of the hot fluid downwardly toward the opposite sides of the part toward the top of the vessel 16 so as to sweep the excess solder from the surfaces and return it to the vessel 16. The nozzle heads 20—20 are so arranged that the jets are projected at approximately 15°–45° downwardly from the horizontal. The angular disposition will be varied according to the composition of the solder, the temperature employed and the rate of withdrawal of the part.

The hot fluid is supplied to the nozzle heads 20—20 from the sump 34 by a pump P, the intake side of which is connected by a conductor 36 to the bottom of the sump and the discharge side of which is connected by a conductor 38 to the nozzle heads 20—20. A coil 40 in the sump provides for heating the condensate to the desired temperature independently of the temperature of the fluid at the bottom of the treating chamber. A high level return pipe 42 connects the sump to the treating chamber.

If the fluid from which the vapor is generated is of a sufficiently high boiling point, the heat from the fluid itself will suffice to melt the solder. If, however, a fluid of lower boiling point is used, the vessel 16 may have to be heated by, for example, a heating coil 44 within it.

It may be desirable, in some cases, that the operating vapor be at a temperature less than that of the solder, and this can be done either by using a lower temperature fluid or by heating the solder above the vapor temperature or both.

The apparatus as thus described takes advantage of the condensation of the saturated inert vapor for raising the temperature of the part as it is moved therethrough for immersion in the melted solder to a uniform temperature which is substantially that of the solder, thereby reducing or eliminating thermal shock which may adversely affect the part for its intended use. As previously mentioned, it is desirable to use a fluid which has a boiling point temperature high enough to melt the solder, thus to make it unnecessary to heat the vessel 16. A fluid appropriate for melting and maintaining the solder melted is FC-70. If an atmosphere of saturated vapor is maintained in the treating chamber 12 at a temperature of 410° F., which is the approximate temperature of the molten solder, the zonal thickness of the atmosphere should be sufficiently extensive in the direction of movement of the part through it to enable raising the temperature of the part to that of the bath while traveling from the ambient atmosphere through the saturated vapor into the solder bath. The rate, of course, will depend not only on the thickness of the zonal layer and the temperature of the vapor, but also on the initial temperature of the part prior to introduction.

The invention as thus described provides by utilization of the highly dense material for heat transfer and solder removal, separate control of the means for effecting solder removal, the means for effecting heat transfer and the means for heating the solder, thus providing for optimum preheating prior to coating and optimum solder flow during leveling.

The separation of the heating means from the solder removal means enables choosing a fluid, the boiling point of which is below, equal to, or above that of the molten solder; enables using a fluid for removing the solder at a temperature equal to or near the boiling point or at some reduced temperature and enables maintaining the solder bath at a temperature equal to the solder wetting temperature or higher. By using a saturated inert vapor, the molten solder is prevented from oxidizing, thus eliminating dross, thereby effecting a saving in solder and keeping the solder bath clean so as to promote good soldering. Further, by separating the heating means from the means for solder removal, the amount of material, specifically the momentum or energy of the solder removal jets, can be selected to its exact optimum without regard for its simultaneous effect on heating or cooling of the article and the vapor temperature may be likewise selected to perform its function properly without regard to the positioning, energy or duration of the solder removal means. The vapor phase allows considerable reduction in the complexity of the equipment and controls over that of the air jet leveling technique referred to which thus allows corresponding savings in the cost of equipment. Since the vapor medium is denser than air and the solder removal is a function of the energy of the jets which, in turn, is a function of the mass and velocity of the jets, the use of the denser material enables reducing the jet velocity, thus to allow greater overall efficiency in solder removal.

While the solder herein referred to is a PbSn compound, it is within the scope of the invention to utilize the method and apparatus thus described for coating parts other than printed circuit boards with solder compositions other than PbSn.

The method and apparatus as herein shown provides for uniformly leveling parts of the kind referred to with uniformly repeatable results and affords the advantages over the prior art of minimizing thermal shock, eliminating hazardous conditions, promoting more uniform solder flow, providing for independent control of the melting of the solder and minimizing oxidation and the production of dross.

It should be understood that the present disclosure is for the purpose of illustration only and includes all modifications or improvements which fall within the scope of the appended claims.

I claim:

1. A method of solder leveling comprising the steps of
   forming a zone of saturated vapors from a selected liquid;
   coating one or more surfaces of an article with solder from a source thereof which is at least partly in said zone of saturated vapors;
   positioning said article, one or more surfaces of which have been coated with solder, in said zone of saturated vapors;
   maintaining said saturated vapor zone at a substantially constant temperature to provide heat so as to maintain the solder on the one or more surfaces of said article in a molten state;
   directing one or more liquid streams of said selected liquid onto the one or more surfaces of said article while said article is positioned in said zone of saturated vapors so as to remove excess molten solder therefrom to provide a leveling of the solder thereon; and
   providing said one or more liquid streams at a selected temperature independently of the temperature of the selected liquid which forms the zone of saturated vapors whereby control of the solder removal is effected separately from the heating required to produce the zone of saturated vapors.

2. The method according to claim 1 wherein said selected liquid is a high density liquid.

3. The method according to claim 2 wherein the saturated vapor zone is maintained at substantially the boiling point of said selected liquid.

4. The method according to claim 1 wherein said liquid streams are directed onto the one or more surfaces of the article at preselected angles within a range from about 15° to about 45°.

5. The method according to claim 1 wherein the said liquid streams are directed onto the surfaces of the article at a preselected pressure within a range from about 5 to about 40 lbs. per square inch.

6. The method of solder leveling comprising
   provising a molten bath of solder for receiving an article having one or more surfaces to be coated with solder,
   generating from a selected liquid a saturated atmosphere of an inert vapor at a substantially constant temperature,
   moving the article through said inert vapor at a rate such that it will become substantially uniformly heated,
   orienting said molten bath of solder at least partly within said inert vapor,
   immersing the article in said bath to coat the one or more surfaces thereof with solder, removing the article from the bath and withdrawing it through said insert vapor, said vapor providing heat so as to maintain the solder in a molten state, and,
   while so withdrawing it, directing one or more streams of said selected liquid against the one or more surfaces of the article in directions opposite to the direction of withdrawal of the article to sweep the surfaces of excess solder, and
   providing said one or more liquid streams at a selected temperature independently of the temperature of the selected liquid which forms the zone of saturated vapors whereby control of the solder removal is effected separately from the heating required to produce the zone of saturated vapors.

7. The method according to claim 6 comprising maintaining the saturated atmosphere of inert vapor quiescent during movement of the article through it on the way to the bath to promote condensation of the vapor on the surfaces of the article as it travels through said vapor.

8. The method according to claim 6 comprising generating said saturated atmosphere of vapor by heating said selected liquid to its boiling point and confining the vapor thus generating in a layer above the solder bath.

9. The method according to claim 6 wherein the step of confining the vapor comprises maintaining a vapor barrier of greater density than that of the saturated vapor above said saturated vapor.

10. The method according to claim 6 wherein said selected liquid is a high density liquid.

11. The method according to claim 6 wherein the substantially uniform heating of the article is achieved by the latent heat of condensation of the saturated vapor on the surfaces of the article as the article is moved through said vapor.

12. The method according to claim 8 and further comprising the step of employing the heat conducted from the boiling liquid and the saturated vapor to melt and maintain the solder molten.

13. The method according to claim 6 comprising projecting said liquid jets of said selected liquid against the one or more surfaces of the article at a preselected angle inclined to said surfaces within a range from about 15° to about 45°.

14. The method according to claim 13 comprising projecting said liquid jets of said selected liquid at a pressure within a range from about 15 to about 40 lbs. per square inch.

15. Apparatus for leveling solder comprising
    a treating chamber,
    means in said treating chamber for providing a molten bath of solder,
    means for maintaining a saturated atmosphere of vapor within a selected region of said treating chamber formed from a selected liquid in said treating chamber, means for moving an article having one or more surfaces to be coated with solder through said treating chamber in said vapor into said molten bath of solder and for moving said article with one or more surfaces coated with said solder through said vapor, said vapor heating said one or more solder coated surfaces so as to maintain said solder in a molten state, means in said treating chamber for projecting one or more liquid streams of said selected liquid against one or more solder-coated surfaces of the article when said article is moving through said vapor in said one or more surfaces of the article, said molten bath and said liquid stream projecting means both being within said saturated vapor region, and means for supplying said selected liquid to said projecting means at a selected temperature independently of the temperature of the selected liquid which forms the zone of saturated vapors whereby control of the solder removal is effected separately from the heating required to produce the zone of saturated vapors.

16. Apparatus for solder leveling comprising
a vessel for holding molten solder,
a treating chamber surrounding the vessel,
means for generating an atmosphere of a saturated inert vapor within a selected region of said treating chamber from a selected liquid in the treating chamber above the molten solder through which an article having one or more surfaces to be coated with solder is required to be moved before it is immersed in the molten solder, means for moving the article through the saturated vapor in one direction to so immerse the article and in the other direction to remove it from the molten solder and from the saturated vapor to the ambient atmosphere, the saturated vapor heating the one or more solder-coated surfaces of said article so as to maintain the solder thereon in a molten state, means in said treating chamber for projecting one or more liquid jets of said selected liquid against the one or more surfaces of the article while being removed in a direction to return the excess solder from the article to the vessel, said molten solder and said liquid jet projecting means both being within said saturated vapor region, and means for supplying said selected liquid to said projecting means at a selected temperature independently of the temperature of the selected liquid which forms the zone of saturated vapors whereby control of the solder removal is effected separately from the heating required to produce the zone of saturated vapors.

17. Apparatus for solder leveling comprising
a vessel for holding a body of molten solder,
means for generating an atmosphere of saturated inert vapor from a selected liquid and for maintaining a zonal layer of said saturated inert vapor above the vessel through which an article having one or more surfaces to be coated with solder must be moved to be immersed in said body of molten solder, at least a portion of said vessel being within said saturated inert vapor, means for removing the article from the molten solder and through the zonal layer to the ambient atmosphere, the saturated vapor heating the one or more solder-coated surfaces of said article so as to maintain the solder thereon in a molten state, jet means located in the zonal area in positions to project one or more streams of said selected liquid against the one or more surfaces of the article as it is withdrawn through said zonal area in a direction to sweep the excess solder from the one or more surfaces into the vessel, and means for supplying said selected liquid to said jet means at a selected temperature independently of the temperature of the selected liquid which forms the zone of saturated vapors whereby control of the solder removal is effected separately from the heating required to produce the zone of saturated vapors.

18. Apparatus for solder leveling comprising
a treating chamber,
a vessel within the treating chamber,
said treating chamber providing at the bottom a receptacle for holding a selected liquid for boiling and at the top an enclosure for containing an atmosphere of saturated vapor within a selected region of said treating chamber generated by the boiling of said selected liquid at the bottom and said vessel holding a body of molten solder, means at the bottom of the treating chamber for heating the selected liquid to its boiling point, means for moving an article having one or more surfaces to be coated with solder through the saturated vapor at the top of the treating chamber into the molten solder contained in the vessel at the bottom of the treating chamber and for removing it from the molten solder through the saturated vapor to the ambient atmosphere, the saturated vapor heating the one or more solder-coated surfaces of said article so as to maintain the solder thereon in a molten state, means in said treating chamber for projecting one or more liquid jets of said selected liquid onto the one or more surfaces of the article to sweep the excess solder from the one or more surfaces of the article back into the vessel, said molten solder and said liquid jet projecting means both being within said saturated vapor region, and means for supplying said selected liquid to said projecting means at a selected temperature independently of the temperature of the selected liquid which forms the zone of saturated vapors whereby control of the solder removal is effected separately from the heating required to produce the zone of saturated vapors.

19. Apparatus according to claim 18 wherein said supply means includes means at the top of the treating chamber for effecting condensation of the saturated vapor at the top of the treating chamber.

20. Apparatus according to claim 18 wherein said supplying means includes a cooling coil at the top of the treating chamber for effecting condensation of the saturated vapor at the top of the treating chamber.

21. Apparatus according to claim 20 wherein said supplying means includes means below the cooling coil for collecting the condensate.

22. Apparatus according to claim 19 wherein said supplying means includes
a sump, and
means for conducting the condensate from the treating chamber to the sump.

23. Apparatus according to claim 22 wherein said supplying means includes means for heating the condensate in the sump.

24. Apparatus according to claim 22 wherein said supplying means includes a pump for pumping the condensate in the sump to the jets within the treating chamber.

25. Apparatus according to claim 22 wherein said supplying means includes a high level return pipe from the sump to the bottom of the treating chamber.

26. The method according to claim 6 wherein the liquid is selected to provide a vapor at a temperature lower than that of the molten bath of solder.

27. The method according to claim 6 wherein the liquid is selected to provide a vapor at a temperature which is approximately that of the molten bath of solder.

28. The method according to claim 6 and further including heating the molten bath of solder to a temperature higher than that of the vapor.

29. The method according to claim 6 wherein the liquid is selected to provide a boiling point which is lower than the temperature of the molten solder and further including the step of heating the molten bath of solder to a temperature higher than that of the vapor.

* * * * *